United States Patent
Ramesh et al.

[19]

[11] Patent Number: 5,936,978
[45] Date of Patent: Aug. 10, 1999

[54] SHORTENED FIRE CODE ERROR-TRAPPING DECODING METHOD AND APPARATUS

[75] Inventors: Rajaram Ramesh; Kumar Balachandran, both of Cary, N.C.

[73] Assignee: Telefonaktiebolaget L M Ericsson (publ), Stockholm, Sweden

[21] Appl. No.: 08/759,614

[22] Filed: Dec. 5, 1996

[51] Int. Cl.$^6$ .................................................. H03M 13/00
[52] U.S. Cl. ........................ 371/39.1; 371/37.7; 371/45
[58] Field of Search ................... 371/37.11, 37.4, 371/38.1, 39.1, 45, 37.7

[56] References Cited

U.S. PATENT DOCUMENTS

| | | | |
|---|---|---|---|
| 3,811,108 | 5/1974 | Howell | 340/146.1 |
| 3,831,143 | 8/1974 | Trafton | 371/37.4 |
| 4,151,510 | 4/1979 | Howell et al. | 340/146.1 |
| 4,584,686 | 4/1986 | Fritze | 371/37.11 |
| 4,677,623 | 6/1987 | Iwasaki et al. | 371/40 |
| 4,698,813 | 10/1987 | Erdel | 371/40 |
| 4,916,702 | 4/1990 | Berlekamp | 371/39.1 |
| 5,107,506 | 4/1992 | Weng et al. | 371/39.1 |
| 5,280,488 | 1/1994 | Glover et al. | 371/37.11 |
| 5,377,207 | 12/1994 | Perlman | 371/37.11 |
| 5,381,423 | 1/1995 | Turco | 371/39.1 |

OTHER PUBLICATIONS

IBM Technical Disclosure Bulletin, vol. 30, No. 5, Oct. 1987, "Reverse Rotation Fire Code ECC Correction", pp. 41–44, XP002056638.

Prentice–Hall, Englewood Cliffs, NJ, 1983, "Cyclic Codes", S. Lin and D. J. Costello, pp. 85–124 XP002056639.

Prentice–Hall, Englewood Cliffs, NJ, 1983, "Burst–Error–Correcting Codes", S. Lin and D. J. Costello, pp. 257–269, XP002056640.

*Primary Examiner*—Emmanuel L. Moise
*Attorney, Agent, or Firm*—Jenkens & Gilchrist, P.C.

[57] ABSTRACT

An error-trapping decoder is provided that performs right cyclic shifts of a received shortened codeword in a decode shift register. Consequently, the error burst portion of the received codeword is encountered in the register within the length of the shortened code. In other words, the number of right cyclic shifts required by the shift register to encounter the error burst portion of the received word is on the order of the length of the shortened word.

19 Claims, 3 Drawing Sheets

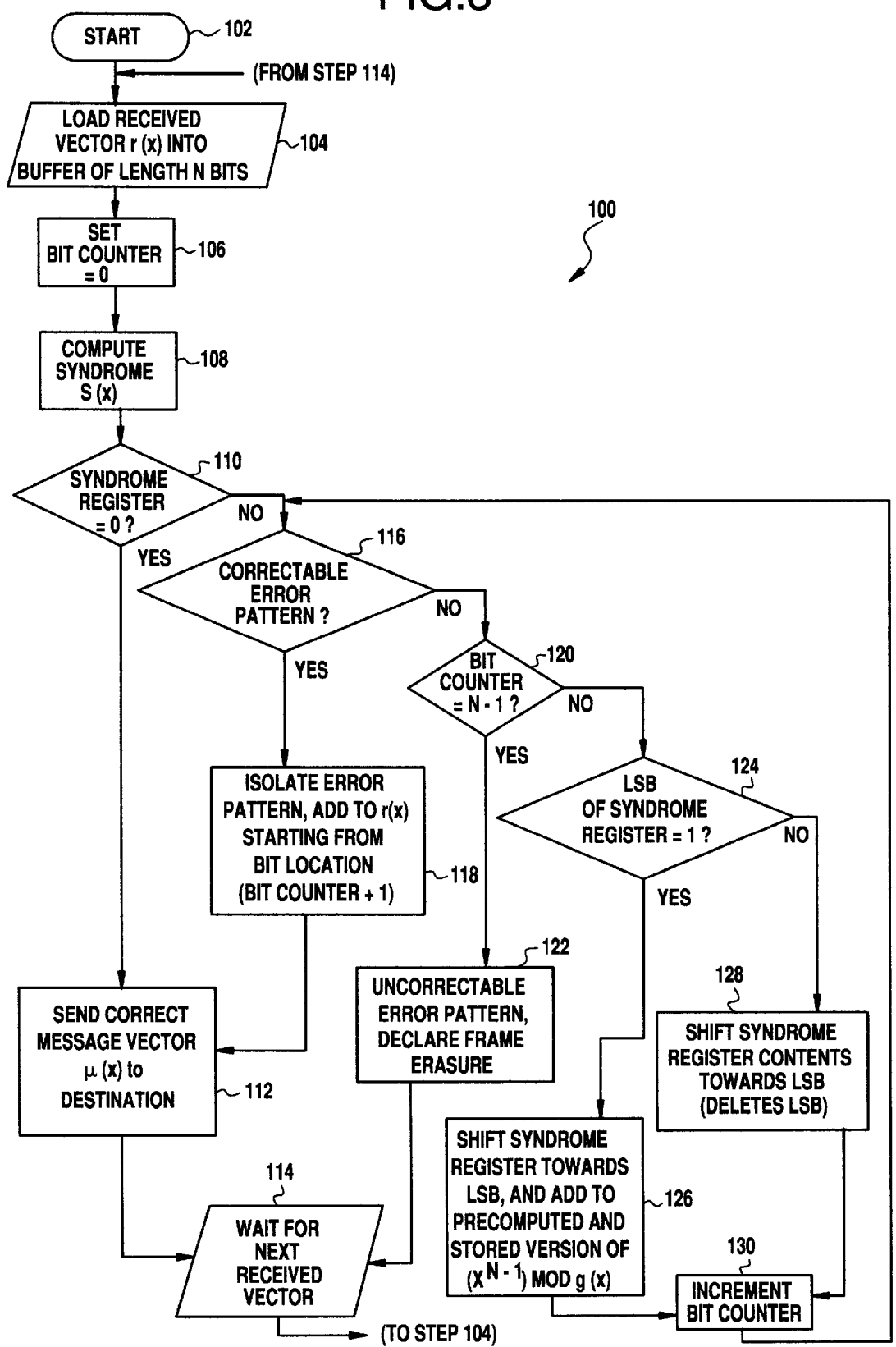

SHORTENED FIRE CODE ERROR-TRAPPING DECODING METHOD AND APPARATUS

BACKGROUND OF THE INVENTION

1. Technical Field of the Invention

The present invention relates generally to the field of data communications error correction and, in particular, to a method and apparatus for decoding shortened fire codes using error trapping.

2. Description of Related Art

Conventional high-speed data communications systems commonly use cyclic redundancy check (CRC) error detection codes to detect and correct received data transmission errors. These errors can be caused by numerous transmission disturbances, such as fading, channel noise or signal interference (e.g., from frequency co-use or jamming).

A particular cyclic code error detection and correction scheme is disclosed in U.S. Pat. No. 5,381,423 to Turco ("Turco"). Turco discloses that a certain class of cyclic codes (known as "Fire Codes") can be used to systematically correct burst errors in transmission channels. A "burst error" is a long sequence of error symbols delimited on either end by non-zero error values. Here, a zero error value is used to denote the absence of an error.

Mathematically, a codeword polynomial can be used to represent the information to be transmitted (information word) and the Fire Code. For example, a generator polynomial for a Fire Code can be expressed as follows:

$$g(X)=(1+X^{2t-1})p(X) \quad (1)$$

where t is defined as the burst correction capability of the Fire Code, and p(X) is an irreducible polynomial. The term ρ ("rho") is defined as the period of p(X). In other words, ρ is the smallest integer, such that p(X) divides $(X^\rho+1)$. Also, t is a positive integer, such that the expression (2t−1) is not divisible by ρ. The length, n, of the Fire Code (number of bits in each Fire Code word) is the least common multiple of the expressions (2t−1) and ρ. Notably, the expression $(X^n+1)$ is divisible by the Fire Code generator polynomial, g(X).

The information word (e.g., k information bits) to be transmitted can be expressed as a polynomial of degree (k−1). If the expression $\{u_0, \ldots, u_{k-1}\}$ represents the bits in the information word, then the information word polynomial can be represented by:

$$u(X)=u_0+u_1X+\ldots+u_{k-1}X^{k-1}. \quad (2)$$

Given all of the above, a codeword polynomial, c(X), to be transmitted can be represented by:

$$c(X)=X^{n-k}u(X)+f(X), \quad (3)$$

where $$f(X)=X^{n-k}u(X)\bmod g(X). \quad (4)$$

From equations 3 and 4, it is evident that:

$$c(X)=0\bmod g(X). \quad (5)$$

In an exemplary operational setting, a codeword, c(X), is transmitted as a burst over a communications channel. Assuming that a burst error has occurred during the transmission, a corrupted version of the transmitted codeword is received at the channel receiver. The received codeword, r(X), can be represented by the expression:

$$r(X)=c(X)+e(X), \quad (6)$$

where e(X) is an error bit pattern. The received codeword, r(X), can be considered as a single polynomial from which a single syndrome can be computed by shifting the received word in one direction, and errors can be corrected by shifting the received word in the opposite direction. The syndrome of the received word can be represented by the expression:

$$s(X)=r(X)\bmod g(X)=e(X)\bmod g(X). \quad (7)$$

Consequently, as illustrated by equation 7, the syndrome of the received word depends on the error bit pattern in the received word.

A device commonly used for burst error correction is known as an error-trapping decoder. Its operation is based on the premise that, for some amount of cyclic shifting of the received word, the error in the burst can be isolated down to the final t bits of the syndrome. So, in accordance with that premise, an error-trapping decoder operates as follows.

For each cyclic shift of a received word, the decoder calculates a syndrome for the word. When the decoder determines that the first n-k-t bits of the syndrome are zero, the last t bits of the syndrome represent the burst error that occurred in the shifted, received word. Errors are then corrected by shifting the received word by the corresponding number of bits in the reverse direction.

Existing error-trapping decoders commonly use "left cyclic shifting" to decode received words. Mathematically, the left cyclic shift of a received word, r(X), of length n, can be expressed as:

$$r^{(1)}(X)=Xr(X)\bmod(X^n+1). \quad (8)$$

In terms of its syndrome, s(X), the received word r(X) can be expressed as:

$$r(X)=a(X)g(X)+s(X) \quad (9)$$

for some value of the term, a(X). Consequently, the syndrome, $s^{(1)}(X)$, for the left cyclic-shifted received word, $r^{(1)}(X)$, can be derived as follows:

$$s^{(1)}(X)=r^{(1)}(X)\bmod g(X) \quad (10)$$

$$=Xr(X)\bmod(X^n+1)\bmod g(X) \quad (11)$$

$$=Xr(X)\bmod g(X) \quad (12)$$

$$=(Xa(X)g(X)+Xs(X))\bmod g(X) \quad (13)$$

$$=Xs(X)\bmod g(X) \quad (14)$$

Equation 12 can be derived as shown, because the expression $(X^n+1)$ is divisible by g(X). Notably, as demonstrated above, the error-trapping decoder can determine the syndrome of the left cyclic-shifted received word by using just the syndrome of the received word. This principle is used for correcting burst errors in existing error-trapping decoders.

In many burst error correction applications, the overall length of the Fire Code word and information word (n+k) obtained using standard Fire Codes can be inappropriate, because the resulting words are often too long for practical systems. Consequently, shortened versions of code words are used. In order to shorten a Fire-Coded word for transmission, some of the information bits are set to zero, the parity bits are located, and only the non-zeroed information bits and parity bits are transmitted. By setting l information bits to zero from the (n, k) word combination, and not transmitting these l information bits, the (n, k) Fire-Coded word can be shortened to an (n−1, k−1) coded word. The transmitter and receiver agree that these 1 bits will always be zero.

For example, using the European Global System for Mobile Communications (GSM) protocol, a standard Fire-Coded word of length (3014633, 3014593) can be shortened to a length (224, 184). This shortened codeword can be used to correct all burst errors of length 12 bits or less.

In reality, the (224, 184) Fire Code is merely the longer (3014633, 3014593) Fire Code with zeros substituted for the least significant 3014409 information bits. Alternatively, a representation of the information may be described as:

$$u(X)=X^{3014409}(u_0+u_1X+u_2X^2+\ldots+u_{183}X^{183}) \quad (15)$$

Conceptually, these 3014409 least significant bits with a value of zero, are the first bits to be shifted into the decoder's polynomial division circuit (e.g., see FIG. 2 below). However, since the expression 0modg(X)=0, this operation is not explicitly necessary, and the actual information bits are shifted into the polynomial division circuit, as well as into the channel. When all 184 bits are shifted into the polynomial division circuit, the remainder of the division process gives the parity polynomial p(X). These parity bits follow the information bits into the channel.

FIGS. 1A and 1B illustrate two conventional bit configurations that are used to encode shortened Fire-Coded words. In the configuration shown in FIG. 1A, the information bits and parity bits are contiguous. In the configuration shown in FIG. 1B, the information bits and parity bits are not contiguous. The dummy information bits are not transmitted. The configuration shown in FIG. 1A is preferred over the configuration shown in FIG. 1B, because the configuration in FIG. 1B may separate burst errors that occur in the transmission into two shorter burst errors, which the decoder in the receiver may not be equipped to handle.

In the case of FIG. 1B, the zero bits will be explicitly shifted into the channel, or the parity bits will be computed indirectly using other polynomial algebra techniques, but which increases the number of operations required in the encoding circuitry.

An error-trapping decoder can also be used to decode a shortened Fire-Coded word, by assuming that the first information bits being received and decoded are zero and error-free. However, a problem arises with that decoding scheme, because the decoder must left-shift the received coded word a substantial number of times before the error burst portion of the code word is encountered. In fact, the number of such shifts needed is on the order of the length of an unshortened coded word. Consequently, for a standard GSM codeword, about 3 million left-shift operations would be required, which significantly increases error correction delays and thereby reduces data throughput.

One solution to this problem is described in the textbook: "Error Control Coding: Fundamentals and Applications" by S. Lin and D. Costello, Prentice Hall, Inc., Englewood Cliffs, N.J., 1983. It is recognized that the problem arises from the process of calculating the syndrome of a left cyclical shift of the received codeword by 1 bits. In other words, the syndrome for decoding a received bit, $r_{n-1-1}$, is equal to the remainder resulting from the division of the expression $X^{n-k+1}r(X)$ by the generator polynomial, g(X), as illustrated by the following equation:

$$X^{n-k-l}r(X)=a_1(X)g(X)+s^{(n-k-l)}(X). \quad (16)$$

Equation 16 infers that premultiplying r(X) can yield the desired syndrome, as illustrated by the expression:

$$\rho(X)r(X)=[a_1(X)+a_2(X)r(X)]g(X)+s^{(n-k-l)}(X). \quad (17)$$

The premultiplication factor, $\rho(X)$, is given by:

$$\rho(X)=X^{n-k-l}+a_2(X)g(X). \quad (18)$$

Equation 18 infers that the syndrome, $s^{(n-k-1)}(X)$ can be obtained by using polynomial logic circuitry that implements the expression, $\rho(X)r(X)/g(X)$. However, a substantial amount of relatively complex hardware is required to implement such a scheme.

A similar result may be obtained by representing the division operation described directly above in terms of reciprocal polynomials. For example, starting with the following expression for the received codeword:

$$r(X)=a(X)g(X)+s(X), \quad (19)$$

the reciprocal of r(X) can be described as follows:

$$X^n r(X^{-1})=[X^{k-1}aX^{-1})][X^{n-k+1}g(X^{-1})]+[X^{n-k}s(X^{-1})]X^k. \quad (20)$$

Note that equation 20 describes the reciprocal cyclic code:

$$r'(X)=a'(X)g'(X)+X^k s'(X). \quad (21)$$

Therefore, the syndrome of the reciprocal cyclic code, r' (X), can be described in terms of the syndrome of the received word, by the expression:

$$v(X)s'(X)\bmod g'(X), \quad (22)$$

whereby the pre-multiplier term, v(X), is equal to the expression: ($X^k$ mod g'(X)). However, similar to the result obtained from implementing circuitry suggested by the article disclosed above, a substantial amount of relatively complex hardware is also required to implement this scheme.

SUMMARY OF THE INVENTION

In accordance with the present invention, an errortrapping decoder is provided that performs right cyclic shifts of a received shortened codeword in a decode shift register. Consequently, the error burst portion of the received codeword is encountered in the register within the length of the shortened code. In other words, the number of right cyclic shifts required by the shift register to encounter the error burst portion of the received word is on the order of the length of the shortened word.

An important technical advantage of the present invention is that the error-trapping decoder hardware required is significantly less complex, consumes less power, and costs substantially less than prior decoders.

Another important technical advantage of the present invention is that software implementation of the present decoding method requires significantly fewer processing operations than conventional methods.

BRIEF DESCRIPTION OF THE DRAWINGS

A more complete understanding of the method and apparatus of the present invention may be had by reference to the following detailed description when taken in conjunction with the accompanying drawings wherein:

FIG. 3 is a flow diagram that illustrates a method for decoding a shortened codeword by cyclic right shifting, in accordance with the apparatus and embodiment illustrated in FIG. 2.

DETAILED DESCRIPTION OF THE PREFERRED EMBODIMENTS

Figure 1A:
FIG. 1A is a block diagram that illustrates a conventional bit configuration that is used to transmit shortened Fire Coded words.
Figure 1B:
FIG. 1B is a block diagram that illustrates a second conventional bit configuration that is used to transmit shortened Fire Coded words.
Figure 2:
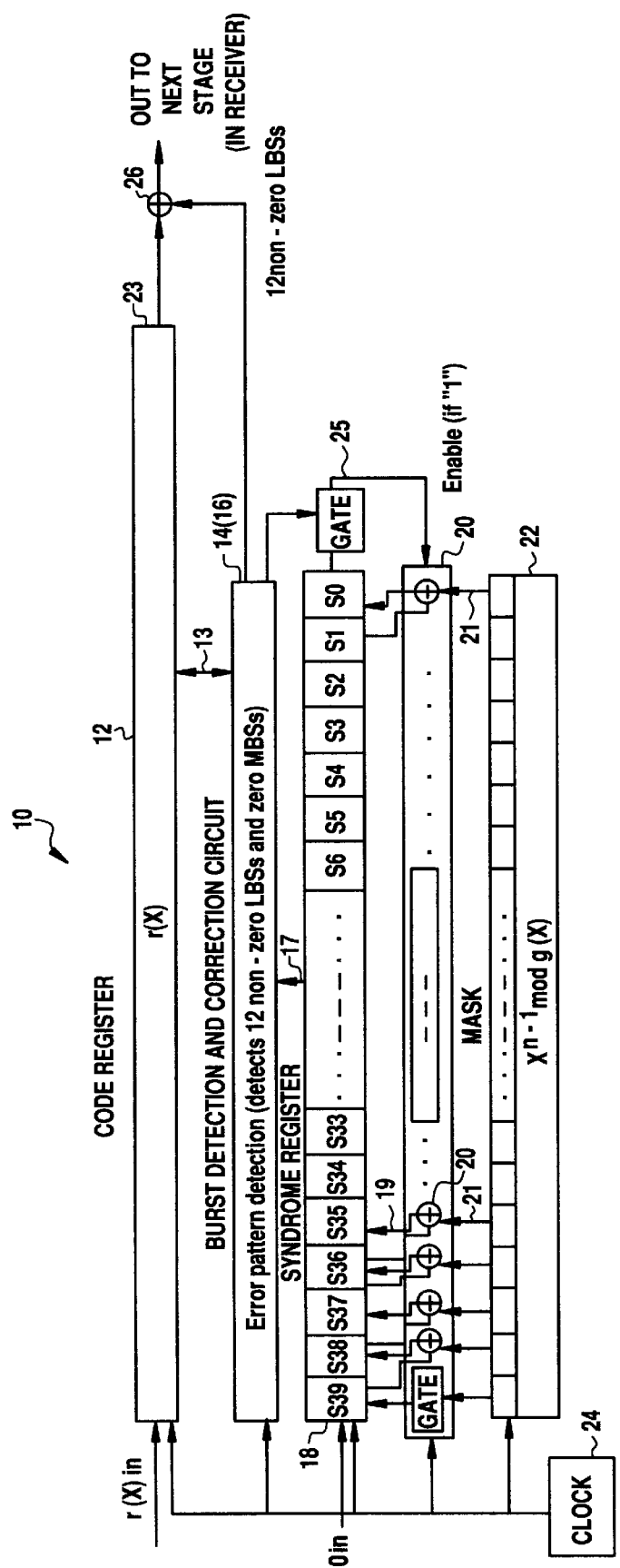
FIG. 2 is a schematic block diagram that illustrates an apparatus and method for decoding a shortened codeword by cyclic right shifting, in accordance with a preferred embodiment of the present invention.

The preferred embodiment of the present invention and its advantages are best understood by referring to FIGS. 1–3 of the drawings, like numerals being used for like and corresponding parts of the various drawings.

Essentially, in accordance with the present invention, an error-trapping decoder is provided that performs right cyclic shifts of a received cyclic (e.g. shortened) codeword in a shift register. Consequently, the error burst portion of the received word is encountered within the length of the shortened code. In other words, the number of right cyclic shifts required by the shift register to encounter the error burst portion of the received word is on the order of the length of the shortened word. On the other hand, the number of cyclic shifts required by prior decoders until the error burst portion is encountered is on the order of the length of the unshortened word, which creates a significant delay in the error correction process. Consequently, the rightshifting decoder of the present invention requires substantially less hardware than prior decoders.

In accordance with the preferred embodiment of the present invention, the syndrome of a received right-shifted word, r(X), is determined as follows. Performing one right cyclic shift of the received word, r(X), is the same operation as performing (n−1) left cyclic shifts, where "n" is the code word length. Consequently, the following expression is derived:

$$r^{-1}(X) = r^{(n-1)}(X) = X^{n-1} r(X) \bmod (X^n + 1). \quad (23)$$

The syndrome of r(X) is s(X). In other words, $$r(X) = a(X)g(X) + s(X), \quad (24)$$

for some a(X). The syndrome, $s^{(-1)}(X)$, of the word, $r^{(-1)}(X)$, is then calculated as follows:

$$s^{-1}(X) = r^{-1}(X) \bmod g(X) \quad (25)$$

$$= X^{n-1} r(X) \bmod (X^n + 1) \bmod g(X) \quad (26)$$

$$= X^{n-1} a(X) g(X) \bmod (X^n + 1) \bmod g(X) + X^{n-1} s(X) \bmod (X^n + 1) \bmod g(X) \quad (27)$$

$$= X^{n-1} a(X) g(X) \bmod g(X) + X^{n-1} s(X) \bmod (X^n + 1) \bmod g(X) \quad (28)$$

$$= X^{n-1} s(X) \bmod (X^n + 1) \bmod g(X). \quad (29)$$

Equation 28 follows because $X^n + 1$ is divisible by g(X).

The syndrome, s(X), is of the polynomial form:

$$s(X) = s_0 + s_1 X + \ldots + s_{n-k-1} X^{n-k-1} \quad (30)$$

Therefore, the syndrome, $s^{(-1)}(X)$, of the cyclically right-shifted word is derived as follows:

$$s^{-1}(X) = X^{n-1} s(X) \bmod (X^n + 1) \bmod g(X) \quad (31)$$

$$= (s_0 X^{n-1} + s_1 X^n + \ldots + s_{n-k-1} X^{2n-k-2}) \bmod (X^n + 1) \bmod g(X) \quad (32)$$

$$= s_0 X^{n-1} + s_1 + s_2 X + \ldots + s_{n-k-1} X^{n-k-2}) \bmod g(X) \quad (33)$$

$$= (s_1 + s_2 X + \ldots s_{n-k-1} X^{n-k-2}) + s_0 X^{n-1} \bmod g(X). \quad (34)$$

As confirmed by equation 34, the syndrome of the cyclical right-shifted word can be determined, by shifting the higher order bits in the original syndrome of the received word and adding a mask word, $(s_0 X^{n-1} \bmod g(X))$. As such, the mask word $(s_0 X^{n-1} \bmod g(X))$ is equal to zero if bit so is "zero", and $(X^{n-1} \bmod g(X))$ if bit $s_0$ is "1". A predetermined value for the term, $(X^{n-1} \bmod g(X))$ can be calculated a priori and stored for use in a mask register (described below) in the decoder. Consequently, in comparison with prior decoders, the computations required to process the received word, R(X), are significantly reduced to a number that is on the order of the shortened word. Using the syndrome of the right-shifted word as expressed in equation 34, the present decoder can decode the received word and isolate the error burst for correction. The error correction operation can be performed by shifting the received word out from the register by the number of bits needed to remove the error burst.

FIG. 2 is a schematic block diagram that illustrates an apparatus and method for decoding a shortened code word by cyclic right shifting, in accordance with a preferred embodiment of the present invention. As used herein, the term "right shifting" is defined in relation to the arrows that show the direction of data traversed in FIG. 2. Consequently, if the structure shown in FIG. 2 were to be laterally inverted, the notion of "right shifting" described herein would in reality be "left shifting". In other words, the present invention is not intended to be limited to one shifting direction.

Referring to FIG. 2, a decoder 10 is shown that includes a code shift register 12. An input of register 12 is connected to an output of the front end of a decoder receiver (not explicitly shown). The bits of the received codeword, r(X), are right-shifted into code shift register 12. In this exemplary embodiment, code shift register 12 is 224 bits long. A plurality of the right-most bit locations of register 12 are connected by data lines 13 to a burst detection and correction circuit 14. Upon determining the length of an error burst (from burst detection circuit 16 described below) in the received word, at adder 26, burst correction circuit 14 adds the error burst bits to the received word bits in code shift register 12. The received word bits plus the burst correction bits are shifted to the right and out of code shift register 12 via adder 26, thereby passing an error corrected word to the next stage in the receiver.

A plurality of data lines (not explicitly shown) connect an output of burst detection circuit 16 to an input of burst correction circuit 14. For clarity, these specific features are not shown, and burst detection and correction circuits 16 and 14 are combined in one block in FIG. 2. In accordance with the syndrome, $s^{(-1)}$ (X), of the right-shifted received word, as expressed in equation 34 above, burst detection circuit 16 detects the presence of a burst of length t or less, in the right-most positions of the syndrome register 18. Syndrome register 18 is configured to contain the syndrome of the word R(X). This syndrome can be calculated in accordance with the teachings of Lin and Costello, as described above. An output of syndrome register 18 is connected by data leads 17 to corresponding inputs of burst detection circuit 16. Each of a plurality of adders (or XOR gates) 20 is connected by a data lead 19 to a corresponding bit location of syndrome register 18. Each of a plurality of outputs 21 of a mask register 22 is connected to each of adders 20. Mask register 22 is configured to contain bits of the mask word, $S_o x(n-1)$ mod g(X)). An output of code register 12 is coupled by data line 23 to adder 26 and the next stage in the receiver. Data line 25 couples the right-most bit of syndrome register 18 to adders 20. A system clock 24 for synchronizing the operations of each of the circuits and registers shown in FIG. 2 is connected to each such circuit and register.

In operation, a received shortened codeword is right-shifted into code register 12 and syndrome register 18. The received word is right-shifted out of code register 12 on data line 23. Referring to equation 34 above, as long as the bit at the right-most position in syndrome register 18 is "zero", the mask value in mask register 22 is equal to zero. In other words, if the mask value is equal to zero ($s_0=0$), then the syndrome (in register 18) of the right-shifted word is equal to ($s_1+s_2X+ \ldots +s_{n-k-1}X^{n-k-2}$). Consequently, the word in code shift register 12 is shifted out once to the right. However, when the output bit from syndrome register 18 is "1", adders 20 are enabled, and the mask value in mask register 22 is added to the value of the syndrome in syndrome register 18. In other words, if $s_0=1$, then the syndrome (in syndrome register 18) is equal to the sum of the quantity ($s_1+s_2X+ \ldots +s_{n-k-1}X^{n-k-2}$) and the predetermined value of ($X^{n-1}$ mod $g(X)$). Consequently, the word in code shift register 12 is shifted once.

The syndrome bits in syndrome register 18 are coupled to the corresponding bit locations in burst detection circuit 16. The bit pattern in syndrome register 18 is coupled to the corresponding bit locations in burst detection circuit 16. The upper-most t bits in burst detection circuit 16 are coupled to corresponding bit locations in burst correction circuit 14. When a burst of length t or less, is detected, burst error correction circuit 14 adds these bits to the word in code register 12, and the error correction process is thus completed. The remainder of the bits in code register 12 are consequently shifted out.

FIG. 3 is a flow diagram that illustrates a method for decoding a shortened codeword by cyclic right shifting, in accordance with the decoding apparatus and embodiment shown in FIG. 2. The method (100) shown in FIG. 3 may be implemented with software, which is operating under the control of a microprocessor (not explicitly shown). Essentially, a correctable error pattern has a sequence of zeros in the (n-k-1-t) most significant positions of the syndrome register. The (t) least significant bits form the correctable error pattern, which has at least one non-zero element. For the GSM embodiment, t=12, n=224 and k=184.

Specifically, at step 104, the received shortened codeword, r(X), is loaded (right shifted) into code register 12 (FIG. 2). The code register is n bits long. The syndrome, s(X), of the right-shifted word is calculated for every right shift of the received codeword, r(X). At step 106, a bit counter (not explicitly shown) is set to zero. Each right shift of a bit from the received codeword, r(X), into the code register increments the bit counter by one. The least significant bit of the syndrome register 18 is used to enable the adders 20. At step 108, the syndrome of the received code word is computed. At step 110, the contents of the syndrome register are analyzed to determine whether there is a 12 bit error pattern (e.g., for the GSM) in that register and all other bits in the register are zero. If not, then it is assumed that there is no error pattern and the message vector, u(X), is shifted out to the next stage in the receiver. At step 114, the decoder awaits the next received code word, r(X).

If, however, at step 110, the contents of the syndrome register contains a 12 bit error pattern and all other bits are zero, at step 116, it is assumed that a correctable error pattern has been detected. At step 118, the adders 20 are disabled, and the contents of the syndrome register (including the error pattern) are added to the received code word, r(X), as it is right shifted out of the code word register. At step 118, the 12 bit error pattern is added to the received code word starting at the bit location (bit counter value +1). At step 114, the decoder awaits the next received code word, r(X). If another code word, r(X), is received, the flow returns to step 104.

At step 116, if it is determined that there is not a 12 bit error pattern (with all of the other bits equal to zero) in the syndrome register, at step 120, the value of the bit counter is analyzed to determine whether it is equal to (n-1). If so, and no correctable bit pattern has been detected, at step 122, the system declares that a "frame erasure" has occurred and the flow proceeds to step 114 to await the next received code word.

If, at step 120, the bit count is determined not to be (n-1), at step 124, the syndrome register is analyzed to determine whether the least significant bit is equal to "1". If so, then the bits in the syndrome register are right shifted towards the least significant bit and added to the predetermined mask word, ($X^{n-1}$)modg(X), stored in mask register 22. For this embodiment, the mask word, ($X^{n-1}$)Modg (X), is $X^{39}+X^{25}+X^{22}+X^{16}+X^2$. At step 130, the bit counter is incremented by one. If, however, at step 124, the least significant bit in the syndrome register is not equal to "1", then at step 128, the contents of the syndrome register are right shifted towards the least significant bit, which is thus deleted. At step 130, the bit counter is incremented by one, and the flow returns to step 116.

Although a preferred embodiment of the method and apparatus of the present invention has been illustrated in the accompanying drawings and described in the foregoing Detailed Description, it will be understood that the invention is not limited to the embodiment(s) disclosed, but is capable of numerous rearrangements, modifications and substitutions without departing from the spirit of the invention as set forth and defined by the following claims.

What is claimed is:

1. A method for decoding a cyclic codeword, comprising the steps of:

loading said cyclic codeword into a first storage location;

computing a syndrome of said cyclic codeword;

loading said syndrome into a second storage location;

determining if a least significant bit of said syndrome is equal to a predetermined value;

shifting contents of said second storage location towards said least significant bit, if said least significant bit is not equal to said predetermined value; and shifting said contents of said second storage location towards said least significant bit and adding said contents to a mask word, if said least significant bit is equal to said predetermined value.

2. The method according to claim 1, wherein said first storage location is a shift register.

3. The method according to claim 1, wherein said loading said cyclic codeword step comprises the step of right-shifting said received codeword into said first storage location.

4. The method according to claim 1, wherein said predetermined value is equal to 1.

5. The method according to claim 1, wherein said cyclic codeword is a vector equal to r(X), said first storage location is n bits long, and said mask word is equal to ($X^{n-1}$)modg (X).

6. The method according to claim 1, wherein said cyclic codeword comprises a fire coded word.

7. The method according to claim 1, wherein said cyclic codeword comprises a shortened cyclic code.

8. A fire code decoder, comprising:

a codeword memory means for storing a codeword to be decoded;

a syndrome memory means associated with said codeword memory means for storing a syndrome of said codeword; and a mask word means, said mask word means being at least indirectly in electronic communication with said syndrome memory means, for storing a predetermined word and enabling an addition of said predetermined word with said syndrome, in response to a detection of a predetermined bit value in said syndrome memory means.

9. The fire code decoder of claim 8, wherein said codeword memory means comprises an n-bit accumulating register.

10. The fire code decoder of claim 8, wherein said syndrome memory means comprises a register.

11. The fire code decoder of claim 8, wherein said mask word means includes a plurality of adders, each of said adders connected between a respective bit location of said syndrome memory means and said mask word means.

12. The fire code decoder of claim 8, wherein said predetermined word comprises $(X^{n-1}) \bmod g(X)$.

13. The fire code decoder of claim 8, wherein said predetermined word comprises $(X^{39}+X^{25}+X^{22}+X^{16}+X^2)$ and contents of said syndrome memory means comprises a 12 bit error pattern.

14. The fire code decoder of claim 8, wherein said predetermined bit value comprises "1".

15. The fire code decoder of claim 8, wherein said fire code comprises a shortened cyclic code.

16. A fire code decoder, comprising:

a first storage location for storing a codeword to be decoded;

a second storage location associated with said first storage location for storing a syndrome of said codeword;

a third storage location for storing a predetermined word and enabling an addition of said predetermined word with said syndrome, in response to a detection of a predetermined value in said second storage location; and wherein said third storage location is at least indirectly electrically connected to said second storage location.

17. The fire code decoder of claim 16, wherein said fire code comprises a shortened cyclic code.

18. The fire code decoder of claim 16, wherein at least one of said first, second and third storage locations comprises a shift register.

19. The fire code decoder of claim 16, wherein said predetermined value comprises a logical "1".

* * * * *